(12) United States Patent
Ramanath et al.

(10) Patent No.: US 7,026,716 B2
(45) Date of Patent: Apr. 11, 2006

(54) SELF-ASSEMBLED SUB-NANOLAYERS AS INTERFACIAL ADHESION ENHANCERS AND DIFFUSION BARRIERS

(75) Inventors: Ganapathiraman Ramanath, Clifton Park, NY (US); Pethuraja Gopal Ganesan, Troy, NY (US); Kunjukrishna Pillai Vijayamohanan, Pune (IN)

(73) Assignee: Rensselaer Polytechnic Institute, Troy, NY (US)

( * ) Notice: Subject to any disclaimer, the term of this patent is extended or adjusted under 35 U.S.C. 154(b) by 45 days.

(21) Appl. No.: 10/741,981

(22) Filed: Dec. 19, 2003

(65) Prior Publication Data

US 2004/0245518 A1    Dec. 9, 2004

Related U.S. Application Data

(60) Provisional application No. 60/476,660, filed on Jun. 6, 2003.

(51) Int. Cl.
*H01L 23/532* (2006.01)
*H01L 21/47* (2006.01)

(52) U.S. Cl. .............. 257/762; 257/741; 257/751; 438/623; 438/627; 438/628; 438/687

(58) Field of Classification Search ............... 257/741, 257/751, 762; 438/623, 627, 628, 687
See application file for complete search history.

(56) References Cited

U.S. PATENT DOCUMENTS

| | | | |
|---|---|---|---|
| 4,996,075 A | 2/1991 | Ogawa et al. | |
| 5,057,339 A | 10/1991 | Ogawa | |
| 5,077,085 A | 12/1991 | Schnur et al. | |
| 5,079,600 A | 1/1992 | Schnur et al. | |
| 5,389,496 A | 2/1995 | Calvert et al. | |
| 5,468,597 A | 11/1995 | Calabrese et al. | |
| 5,500,315 A | 3/1996 | Calvert et al. | |
| 5,510,216 A | 4/1996 | Calabrese et al. | |
| 5,648,201 A | 7/1997 | Dulcey et al. | |
| 5,939,150 A | 8/1999 | Stelzle et al. | |
| 6,348,240 B1 | 2/2002 | Calvert et al. | |
| 6,784,093 B1 * | 8/2004 | Lu et al. ............. | 438/626 |
| 2002/0079487 A1 | 6/2002 | Ramanath et al. | |
| 2002/0105081 A1 | 8/2002 | Ramanath et al. | |

OTHER PUBLICATIONS

Cotell, Catherine et al. (eds); "Surface Engineering;" *ASM Handbook;* 1994; pp. 315-318; vol. 5: ASM International; Materials Park, Ohio.

Hu, Minghui et al.; "Structure and Morphology of Self-assembled 3-Mercaptopropyltrimethoxysilane Layers on Silicon Oxide;" *Applied Surface Science;* 2001; pp. 307-316; vol. 181; Elsevier Science B.V.

(Continued)

*Primary Examiner*—Jerome Jackson
(74) *Attorney, Agent, or Firm*—David J. Aston; Peters, Verny, Jones, Schmitt & Aston, L.L.P.

(57) ABSTRACT

An electrical device is disclosed. The electrical device includes a substrate, and a self-assembled molecular layer on the substrate. The self-assembled molecular layer comprises a plurality of molecules, each molecule comprising a first end proximate to the substrate and a second end comprising sulfur distal to the substrate. A copper layer is on the self-assembled molecular layer.

29 Claims, 8 Drawing Sheets

OTHER PUBLICATIONS

Iler, R. K.; "Multilayers of Colloidal Particles;" *Journal of Colloid and Interface Science;* 1966, pp. 569-594; vol. 21.

Krishnamoorthy, A. et al.; "Self-assembled Near-Zero-Thickness Molecular Layers as Diffusion Barriers for Cu Metalization;" *Applied Physics Letters;* Apr. 23, 2001; vol. 78; No. 17; American Institute of Physics.

Murarka, S. P.; "Materials Aspects of Copper Interconnection Technology for Semiconductor Applications;" *Materials Science and Technology;* Jul. 2001; pp. 749-758; vol. 17.

Porterfield, William; "10.5 Common Ligands and Complexes;" *Inorganic Chemistry;* 1984; pp. 487-488; Addison-Wesley Publishing Company, Inc.; Reading, Massachusetts.

Ramanath, G.; "Gas-Phase Transport of $WF_6$ Through Annular Nanopipes in TiN During Chemical Vapor Deposition of W on $TiN/Ti/SiO_2$ Structures for integrated Circuit Fabrication;" *Applied Physics Letters;* Nov. 18, 1996; pp. 3179-3181; vol. 69; No. 21; American Institute of Physics.

Ramanath, G.; "Self-Assembled Subnanolayers as Interfacial Adhesion Enhancers and Diffusion Barriers for Integrated Circuits;" *Applied Physics Letters;* Jul. 14, 2003; pp. 383-385; vol. 83; No. 2; American Institute of Physics.

Wolf, Stanley et al.; "Silicon Processing for the VLSI Era;" *Process Technology;* 2000; pp. 438, 782-783; vol. 1; Second Edition; Lattice Press; Sunset Beach California.

Ahrens, C. et al., "Electrical characterization of conductive and non-conductive barrier layers for Cu-metallization," Applied Surface Science, 1995, pp. 285-290, vol. 91.

Ding, P.J. et al., "Effects of the addition of small amounts of Al to copper: Corrosion, resistivity, adhesion, morphology, and diffusion," J. Appl. Phys., Spril 1994, pp. 3627-3631, vol. 75(7).

Ding, P.J. et al., "Oxidation resistant high conductivity copper films," Appl. Phys. Lett. May 1994, pp. 2897-2899, vol. 64(21).

McBrayer, J.D. et al., "Diffusion of metals in silicon dioxide," J. Electrochem. Soc., Jun. 1986, pp. 1242-1246, vol. 133(6).

Raghavan, G. et al., "Diffusion of copper through dielectric films under bias temperature stress," Thin Solid Films, 2995, pp. 168-176, vol. 262 (1995).

Reed, M.A. and Tour, J.M., "Computing with molecules," Scienfific American, 2000, pp. 86-93, vol. 282(6).

Sekiguchi, A. et al., "Microstructural and morphological changes during thermal cycling of Cu thin films," J. Japan Inst. Metals, 2000, pp. 379-382, vol. 64(5).

ASM Handbook vol. 5, Surface Engineering, ASM International: Materials Park, Ohio. 1994, pp. 315-318.

Moshfegh, A.Z. et al., "Bias sputtered Ta modified diffusion barrier in $Cu/Ta(V_b/Si(111)$ structures," Thin Solid Films, 2000, pp 10-17, vol. 370.

* cited by examiner

SELF-ASSEMBLED SUB-NANOLAYERS AS INTERFACIAL ADHESION ENHANCERS AND DIFFUSION BARRIERS

CROSS-REFERENCES TO RELATED APPLICATIONS

This U.S. Non-Provisional Patent Application claims the benefit of U.S. Provisional Patent Application No. 60/476,660, filed on Jun. 6, 2003, which is herein incorporated by reference in its entirety for all purposes.

BACKGROUND OF THE INVENTION

Isolating individual components of nanoscale architectures comprised of thin films or nanostructures, without significantly impacting their functionalities, is a critical challenge in micro- and nano-scale device fabrication. One example that illustrates this challenge is seen in Cu interconnect structures for 100 nanometer devices.

A schematic cross-section of a typical copper interconnect structure is shown in FIG. 1(a). FIG. 1(a) shows copper layers 24 interconnected by copper-filled vias 20. Dielectric layers 22 are between the copper layers 24. Barrier layers 28 isolate the copper layers 24 and the copper in the vias 20 from the dielectric layers 22. Without the barrier layers 28, as shown in FIG. 1(b), the copper in a copper layer 24 can diffuse into an adjacent dielectric layer 22 (as shown by the arrows), thus degrading the dielectric properties of the dielectric layer 22.

Some currently used interfacial barrier layer materials include Ta, TaN and TiN. When these layers are deposited by conventional methods, they are difficult to form as uniform and continuous layers. This is especially true when the layers to be deposited are less than 10 nanometers thick, and when the layers are formed in high aspect ratio (e.g., depth to width) features such as vias. This is illustrated schematically in FIG. 1(c). FIG. 1(c) shows a barrier layer 26 that has been vapor deposited in a via. The barrier layer 26 has a non-uniform thickness. Copper 24 fills the remainder of the via. As shown in FIG. 1(c), an uneven barrier layer 26 may have gaps 25 and may not act as a complete barrier between the copper 24 and the dielectric layer 22. Copper 24 can diffuse into the gaps and into the dielectric layer 22. While a thicker barrier layer could be deposited to compensate for the uneven thickness of the barrier layer 26 in a high aspect ratio via, the thicker barrier layer takes up the space meant for low-resistivity Cu, thus neutralizing the advantages of miniaturization.

Newly emerging methods such as atomic layer deposition have the potential to obviate some of these concerns. However, even if 5 nanometer thick conformal films (or thinner conformal films) of conventional barrier materials could be reliably produced, it is not clear if they will be effective. High defect densities and fast diffusion paths such as nanopipes can limit the effectiveness of thin metal barrier layers. Hence, there is a great deal of interest in finding alternative materials and processing methods that solve these problems.

Another problem to be addressed is the potential delamination between a barrier layer and an adjacent copper layer. If a copper layer and barrier layer delaminate, for example in an interconnect structure, the resulting separation could eventually result in the failure of the semiconductor device that uses the interconnect structure.

Embodiments of the invention address these and other problems.

SUMMARY OF THE INVENTION

Embodiments of the invention are directed to electrical devices such as chips, substrates in chip packages, and circuit boards. Other embodiments of the invention are directed to methods for making electrical devices.

One embodiment of the invention is directed to an electrical device comprising: (a) a substrate; (b) a self-assembled molecular layer on the substrate, wherein the self-assembled molecular layer comprises a plurality of molecules, each molecule comprising a first end proximate to the substrate and a second end comprising sulfur distal to the substrate; and (c) a copper layer on the self-assembled molecular layer, wherein the copper layer comprises copper atoms.

One embodiment of the invention is directed to a method for forming an electrical device, the method comprising: (a) providing a substrate; (b) forming a self-assembled molecular layer on the substrate, wherein the self-assembled molecular layer comprises a plurality of molecules, each molecule comprising a first end proximate to the substrate and a second end comprising sulfur distal to the substrate; and (c) forming a copper layer on the self-assembled molecular layer, wherein the copper layer comprises copper atoms.

Another embodiment of the invention is directed to an electrical device comprising: (a) a semiconductor substrate; (b) a self-assembled molecular layer on the substrate, wherein the self-assembled molecular layer comprises a plurality of molecules, each molecule comprising a first end proximate to the substrate and a second end comprising sulfur distal to the substrate, and each molecule being less than about 1 nanometer in length; and (c) a copper layer on the self-assembled molecular layer, wherein the copper layer comprises copper atoms, wherein the electrical device does not exhibit an electrical breakdown after being subjected to bias thermal annealing in flowing nitrogen at 200° C. in a 2 MV/cm electric field for at least about 600 minutes, wherein the electrical breakdown is characterized by $j_{leakage} > 1000$ nA/cm$^2$, and wherein an interface debond energy between the self-assembled molecular layer and the copper layer is greater than about 8 J/m$^2$.

These and other embodiments of the invention are described in further detail below.

DETAILED DESCRIPTION

Figure 1A:
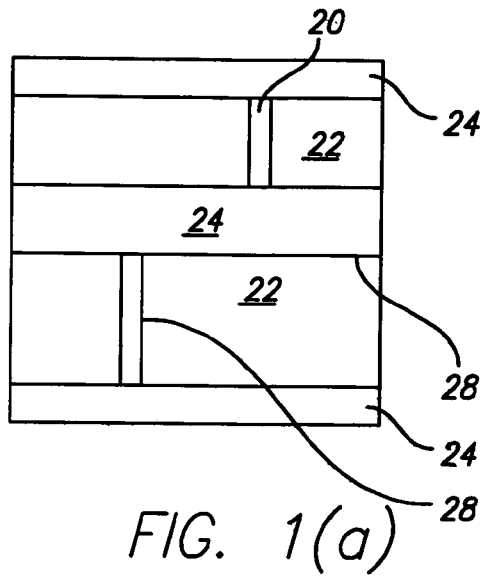
FIG. 1(a) shows a cross-sectional view of a multilayer circuit structure.
Figure 1B:
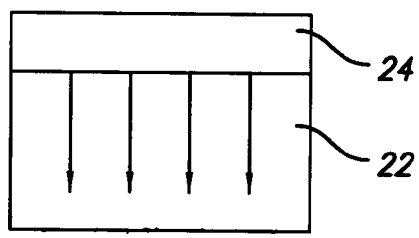
FIG. 1(b) shows a cross-section of a copper layer on a substrate, with arrows showing copper diffusing into the substrate.
Figure 1C:
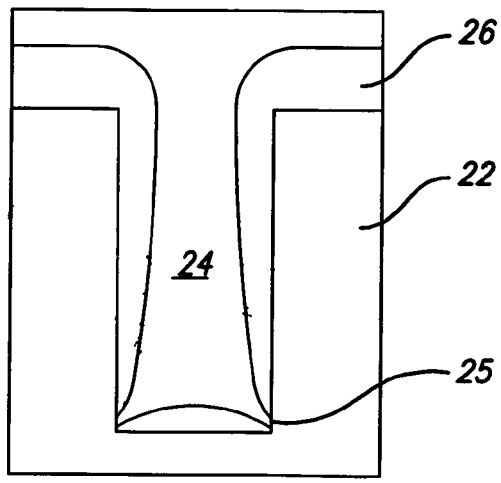
FIG. 1(c) shows a cross-section of a conventional tantalum barrier layer lining walls of a via, and a copper fill in the via.

Self-assembled molecular layers (SAMs) have been widely studied. They have attractive properties. For example, they can be tuned through suitable choice of chain length and terminal groups for a number of applications such as molecular devices, lithography, and micromachines. See, for example, A. Ulman, *Introduction to Ultathin Organic Films: From Langmuir-Blodgett to Self-assembly* (Academic press, San Diego, 1991).

In embodiments of this invention, a sub-nanometer thick SAM is used as both a barrier layer and an adhesion layer between a copper layer and a substrate. The SAM layer can also be used to inhibit corrosion in the copper layer. Each molecule in the SAM has a proximal end that is attached to the substrate and a distal end that comprises sulfur.

Each sulfur atom may originate from a sulfur-containing group (e.g., a thiol group) at the terminal end of a linear molecule. Each proximal end of each molecule used to form the SAM may include another functional group such as an alkoxysilane group. Illustratively, the SAM may be derived from MPTMS or mercaptopropyltrimethyoxysilane, where each molecule in the resulting SAM has a sulfur atom at a distal end and a silicon atom at a proximal end. In preferred embodiments, the substrate may comprise silicon and a silicon oxide (e.g., silicon dioxide) so that the alkoxysilane group at the proximal end of a SAM molecule can react with and bind to a silicon dioxide layer in the substrate.

In the examples below, a ~0.7-nm-thick self-assembled molecular (SAM) layer derived from mercaptopropyltrimethoxysilane (MPTMS) molecules is shown to improve the adhesion of copper to an underlying substrate and also inhibit the diffusion of copper into the underlying substrate. Specifically a Cu/MPTMS-SAM/SiO$_2$/Si(001) structure was formed and exhibited an interface debond energy that was about three times higher than the interface debond energy between a dual layer Cu/SiO$_2$ structure (without a SAM layer). The high debond energy attributed to the former example was believed to be due to the strong chemical interaction between the Cu atoms in the copper layer and the S termini of the MPTMS molecules in the SAM. The MPTMS molecules also immobilized Cu at the Cu/SAM interface and improved (by a factor of 4) copper diffusion induced failure times as compared to similar structures without SAMs.

It is believed that these favorable results were achieved through strong local chemical interaction between interfacial Cu and the sulfur containing terminal groups of the molecules in the SAM. It is also believed that the SAM including sulfur or sulfur containing groups creates a strong interfacial bonding that immobilizes the copper in an adjacent copper layer, and creates a vacuum-like potential barrier between the copper and an adjacent substrate (or dielectric layer therein) to inhibit Cu ionization and transport.

It is also possible to further inhibit copper ionization and transport by selecting SAMs of suitable chain lengths. For example, SAMs with longer chains can inhibit diffusion better than SAMs with shorter chains (assuming similar terminal groups are present in both the long and short chain SAMs). The sulfur-terminated molecules in the SAMs according to embodiments of the invention allow one to use barrier layers (e.g., about 1 to about 2 nanometers or less) that are thinner than conventional barrier layers, because of strong localized bonding between the sulfur and copper. The SAMs according to embodiments of the invention are also self-aligning and conform to structures such as via walls better than conventional barrier layer materials such as tantalum. As noted above, the SAM layer can also be used to inhibit corrosion in a copper layer.

The strong local chemical bonding also obviates the need for interfacial mixing between adjacent layers to produce strong adhesion between the layers. For example, interfacial mixing between a conventional tantalum barrier layer and a copper conductive layer (to form a mixed layer of copper and tantalum) may be needed to enhance the adhesion between these two layers. Interfacial mixing in nanometer thick barrier layers is undesirable, because effects such as crystallization, phase formation and/or grain boundary generation can dramatically degrade barrier properties. In embodiments of the invention, interfacial mixing is advantageously not needed.

Figure 2A:
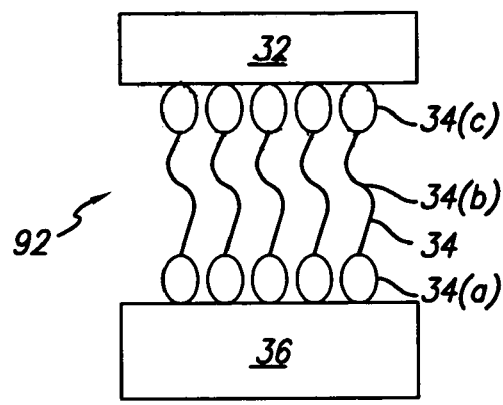
FIGS. 2(a)–2(b) show schematic cross-sections of composites that can be in electrical devices according to embodiments of the invention.
Figure 2B:
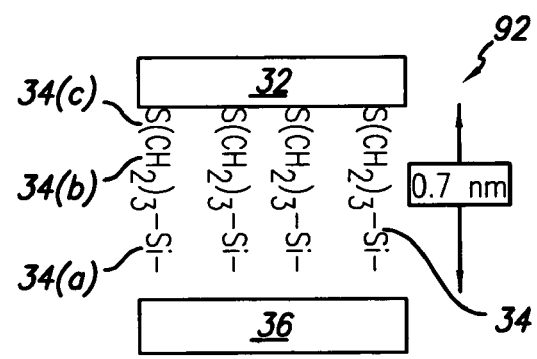

FIGS. 2(a) and 2(b) show schematic depictions of composites 92 that can be used in electrical devices according to embodiments of the invention. Each composite 92 includes a substrate 36 and a copper layer 32. A self-assembled molecular layer 34 is between the copper layer 32 and the substrate 36. The composite 92 can be used in any suitable electrical device including high density chip interconnect structures, circuit boards, etc.

The substrate 36 may comprise any suitable material and any suitable layer or combination of sublayers. For example, in some embodiments, the substrate 36 may comprise a sublayer of silicon (e.g., a wafer) and a sublayer of silicon oxide. In other embodiments, the substrate 36 may comprise a fiber-reinforced polymer substrate that is used in a circuit board, or a polymer dielectric (e.g., polyimide, polyamide, etc.) that is used in a substrate for a chip package. In yet other embodiments, the substrate could be a layer within a multilayer circuit structure. For example, the substrate 36 could be a dielectric layer in a multilayer interconnect structure for a semiconductor chip. Preferably, the substrate 36 comprises a semiconductor such as silicon, GaAs, InP, etc.

The substrate 36 surface may have been pre-treated and/or derivatized so that it has functional groups. The functional groups can react with terminal groups of molecules forming the self-assembled molecular layer 34. For example, the surface of the substrate 36 may be hydroxylated prior to forming the self-assembled molecular layer 36 to provide anchor sites for each molecule in the self-assembled molecular layer 36.

The copper layer 32 may comprise pure copper, or a copper alloy. The copper layer 32 may have any suitable thickness, and may be formed by any suitable process. Exemplary processes for forming the copper layer including vapor deposition, electroplating, electroless plating, sputtering, evaporation, etc. Suitable process parameters can be determined by those of ordinary skill in the art. Vapor deposition processes are preferred, since liquid plating processes generally require catalysts to initiate plating. Such catalysts (e.g., Pd) could inhibit the binding between the SAM layer and an adjacent copper layer and could decrease the adhesion and/or barrier properties of the SAM layer as the catalyst could inhibit the binding of the sulfur atoms in the SAM layer.

The copper layer 32 may have any suitable thickness. For example, in some embodiments, the thickness of the copper layer 32 can be less than about 1 micron, or less than 0.5 microns.

As shown in FIG. 2(a), the SAM layer 34 comprises a plurality of linear molecules. Each molecule in the SAM may be or be derived from a molecule including a first end 34(a) proximate to the substrate 36, a second end 34(c) distal to the substrate 36, and an intermediate portion 34(b) between the first and second ends 34(a), 34(c). As shown in FIG. 2(a), each molecule in the SAM layer 34 may be vertically oriented (or oriented non-parallel or parallel with the substrate surface) with respect to the orientation of the surface of the substrate 36.

The second end 34(c) of each molecule comprises a sulfur atom, and the sulfur atom may be derived from a sulfur-containing functional group such as a thiol group, a sulfide group (e.g., a disulfide group), a sulfone group, sulfonic acid, or a sulfoxide group.

The first end 34(a) of each molecule may comprise any suitable reactive functional group that can react with the surface of the substrate 36, while the intermediate portion 34(b) and the second end 34(c) extend away from the substrate 36. Examples of reactive functional groups include an alkoxysilane group, a thiol group, an alcohol group, a carboxylic acid group, etc.

The intermediate portion 34(b) may be comprise a carbon chain of the formula —$(CH_2)_n$— wherein n is an integer that is less than about 20 or less than about 10. In some embodiments, the intermediate portion 34(b) can include a linear carbon chain (branched or unbranched, and saturated or unsaturated) that is less than about 5 carbon atoms long in some embodiments. In yet other embodiments, the linear chain carbon can be more than 5 carbon atoms long. The hydrocarbon chain may comprise an alkyl, aryl, alkenyl, alkynyl, or any combination thereof.

The SAM layer 34 can be formed using any suitable process. As noted above, it is desirable to form functional groups at the surface of the substrate 36. For example, an $SiO_2$ surface can be treated in a 30% $H_2O_2$–70% $H_2SO_4$ solution at 60° C. for 30 minutes, or an ozone plasma for 15 minutes to form hydroxyl groups at the surface of the substrate 36 to facilitate SAM formation through surface hydroxylation. After surface treating the substrate 36, linear molecules may be deposited from solution or using a vapor deposition process. The linear molecules may include mercaptoalkylalkoxysilanes such as mecaptopropyltrimethoxysilane (HS—$(CH_2)_3$—Si—$(OCH_3)_3$). Suitable process parameters and solution concentrations can be determined by those of ordinary skill in the art.

FIG. 2(b) shows a schematic cross-section of a composite 92 including a SAM layer formed from MPTMS molecules. As shown in FIG. 2(b), a SAM layer 34 between a copper layer 32 and a substrate 36 can be derived from MPTMS molecules. In this example, the second end 34(c) includes a sulfur atom (e.g., derived from a thiol group) and the first end 34(a) includes a silicon atom (e.g., derived from a silane group).

Figure 2C:
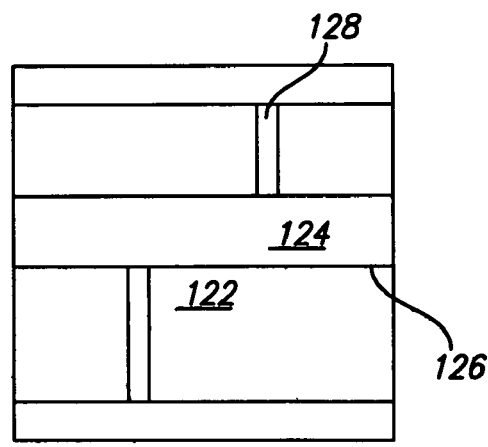
FIG. 2(c) shows a cross-section of a multilayer circuit structure including a self-assembled molecular layer according to an embodiment of the invention.

The composites shown in FIGS. 2(a) and 2(b) could be incorporated into a multilayer interconnect structure such as the one shown in FIG. 2(c). FIG. 2(c) shows dielectric layers 122, and copper layers 124 and copper filled vias 128. A SAM layer 126 may serve as both a barrier layer and an adhesion layer between the dielectric layers 122 and the copper layers 124. As shown, the SAM layer 126 can coat the walls of the vias in the dielectric layers 122 more evenly than conventional barrier layers such as tantalum barrier layers thus allowing for a greater volume of copper within each via 128. The SAM layers 126 also inhibit the diffusion of copper into the dielectric layers 122 and help bind the copper layers 124 to the dielectric layers 122.

It is generally easier to coat the walls of the vias in the dielectric layers 122 with a SAM layer 126 than a barrier layer such as tantalum. As noted above, the SAM layer 126 may be formed using liquid deposition methods and SAMs can self-align, self-assemble, and chemically attach to the sidewalls of the vias, since one terminal group of a linear molecule forming the same will bind to the sidewalls of the vias while the other terminal group at the other end of the molecule does not. Accordingly, the SAMs according to embodiments of the invention are well suited as barrier and adhesion layers in via fill applications.

The dielectric layers 122 in the multilayer interconnect structure shown in FIG. 2(c) may comprise any suitable dielectric material including silicon oxide, porous silicon oxide, metal oxide, silicon nitride, polymeric dielectrics such as polytetrafluoroethylene, polyimide, etc.

The SAMs according to embodiments of the invention exhibit good barrier layer properties. One such test that can be used is a bias thermal annealing (BTA) test. In this test, a composite structure is subjected to flowing $N_2$ at 200° C. in a 2 MV/cm electric field. The leakage current $j_{leakage}$, due to Cu diffusion is recorded at 30 min intervals using a HP4140 picoammeter, after cooling the sample to room temperature for each measurement, until the electrical breakdown of $SiO_2$. Electrical breakdown can be characterized by $j_{leakage} > 1000$ nA cm$^{-2}$. Longer breakdown times are desirable. For example, in some embodiments, breakdown times in excess of 600 minutes are desirable.

The SAMs according to embodiments of the invention also exhibit good interface debond energies (which are characteristic of strong adhesion). For example, the debond energy between the SAM layers according to embodiments of the invention and copper can be in excess of 6 J/m$^2$, or even 8 J/m$^2$.

These and other properties are described in further detail below.

Figure 3:
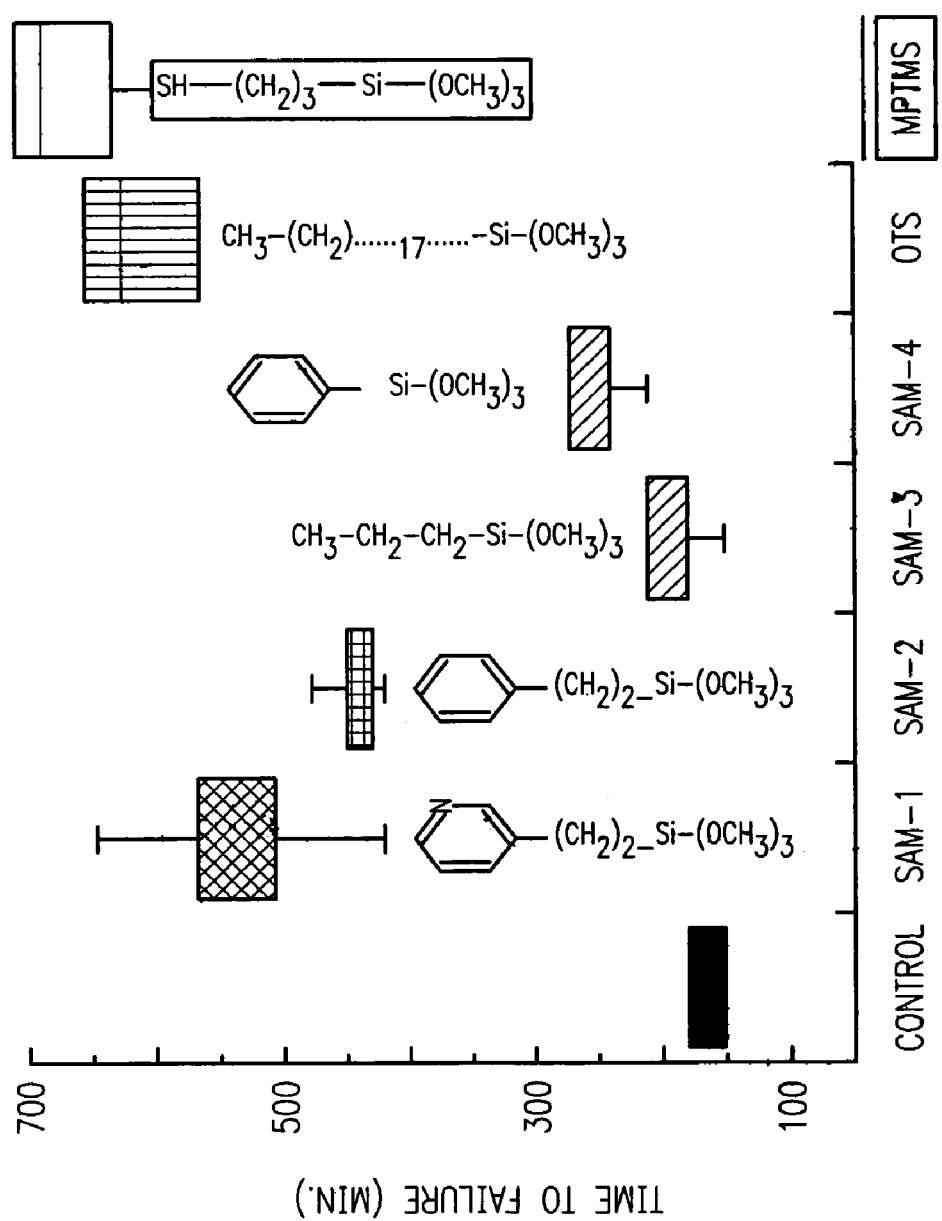
FIG. 3 shows a graph of time of failure vs. different SAMs derived from different molecules.
Figure 4:
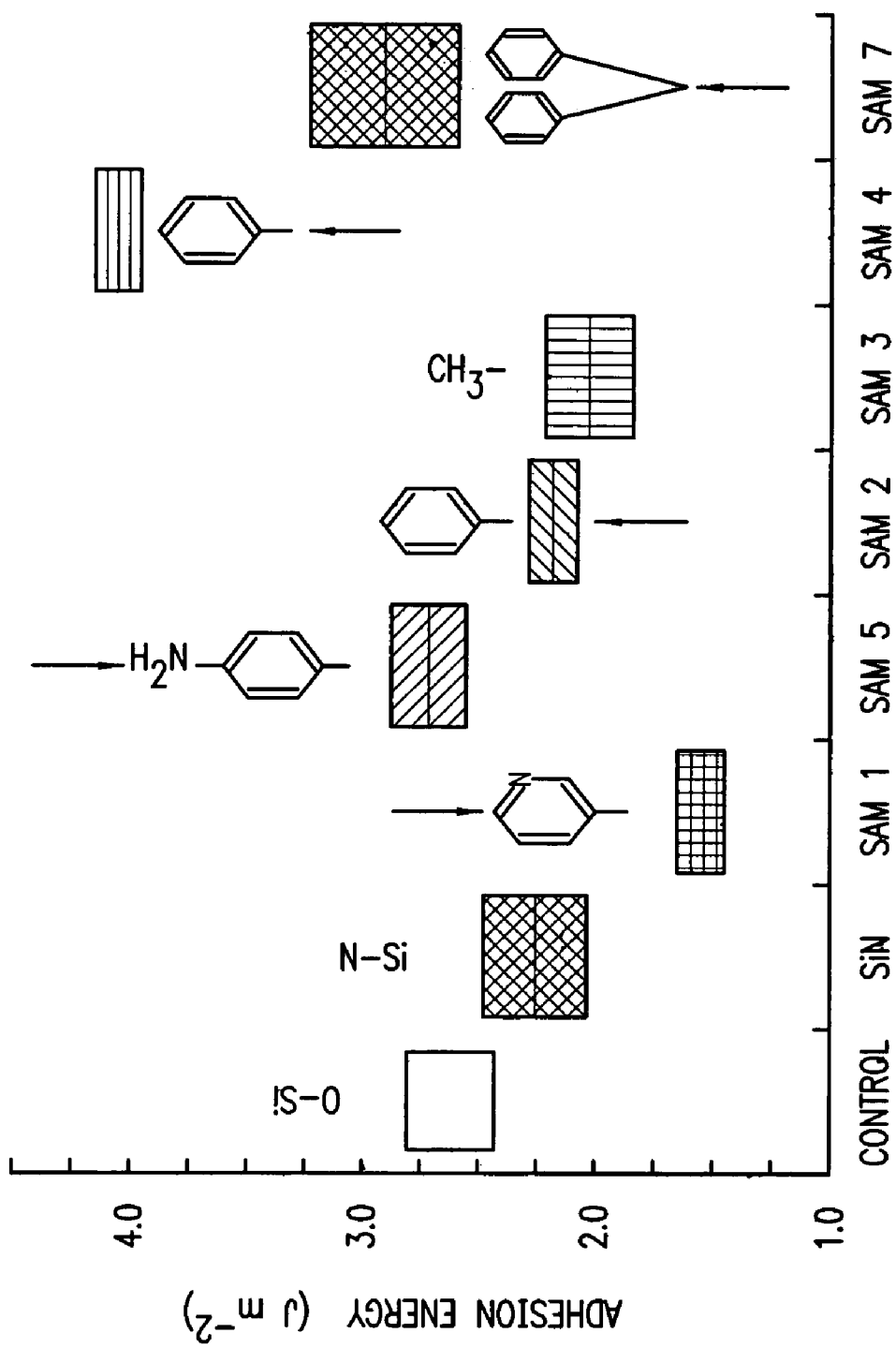
FIG. 4 shows a graph of adhesion energy (J/m$^2$) vs. different SAMs derived from different molecules.
Figure 5:
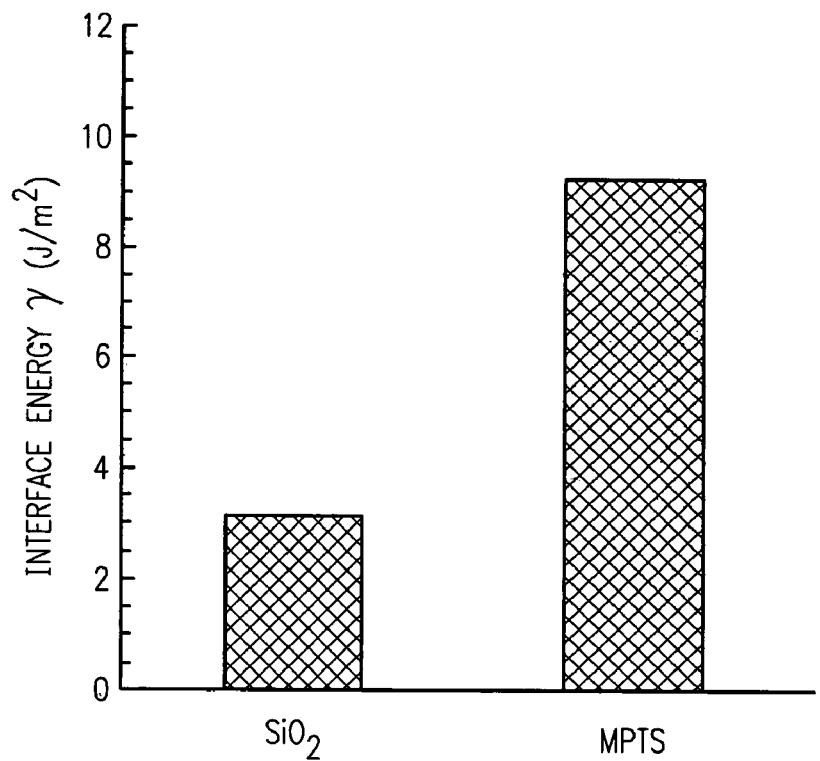
FIG. 5 shows a graph of interface debond energy (J/m$^2$) vs. a composite including SiO$_2$/Cu and a composite including SiO$_2$/MPTMS-SAM/Cu.

FIGS. 3–5 show charts, which illustrate the desirable properties of embodiments of the invention.

FIG. 3 shows a chart of time of failure vs. different SAMs formed from different linear molecules. As shown in FIG. 3, the SAM layer that was formed from MPTMS exhibited a time to failure on the order of about 650–700 minutes. This was improved time to failure was unexpectedly greater than the times to failure for other SAM molecules that were previously tested. The MPTMS SAM (with a linear carbon chain 3 carbons long) exhibited better time to failure properties, even though the SAM was significantly thinner than OTS (which has a carbon chain 17 carbons long). This result was unexpected, because as explained in prior U.S. Patent Application Nos. 60/240,109, filed on Oct. 12, 2000, and 60/244,160 filed on Oct. 27, 2000, longer chains molecules generally provide better barrier properties, and the shorter chain MPTMS would have been expected to produce a shorter time to failure, not a longer time to failure.

FIG. 4 shows a chart of adhesion energy vs. different SAMs formed from molecules with different terminal groups. As shown in FIG. 4, the different terminal groups do not appear to show a meaningful difference in terms of adhesion properties, for example, between a copper layer and an underlying substrate. Although different SAM layers derived from molecules having different terminal groups are used, no examples had adhesion energies greater than about 4 J/m². Low adhesion energy increases the likelihood of delamination.

In contrast, FIG. 5 shows a graph of interfacial bond energy vs. silicon oxide and a SAM layer derived from MPTMS. As shown in FIG. 5, a SAM layer using MPTMS exhibits an interface energy that is above 8 J/m², almost twice the interface energy of the SAM layers shown in FIG. 4 and almost 4 times the interfacial energy between $SiO_2$ and copper. This shows that SAM layers with molecules having sulfur-containing terminal groups can be used as adhesion layers that strongly bind copper to an underlying substrate.

As shown by the foregoing examples, embodiments of the invention have a number of advantages. The SAMs according to embodiments of the invention exhibit improved interfacial bonding, improved diffusion barrier properties, and can also be made thinner than conventional SAMs. This unique set of advantages can be used to produce barrier layers for microelectronic devices, chip package substrates, and circuit boards where diffusion and/or adhesion of copper into an adjacent substrate is of concern. Also, because the SAMs can be made thin in embodiments of the invention, electrical devices that use the SAMs occupy minimal space, and leave more space for conductive copper, thus improving the electrical properties of the formed electrical devices.

The following examples demonstrate the dual use of ~0.7-nm-thick SAMs comprising mecaptopropyltrimethoxysilane [(HS—$(CH_2)_3$—Si—$(OCH_3)_3$—MPTMS] molecules for inhibiting Cu diffusion and enhancing adhesion at Cu/$SiO_2$ interfaces. The strong chemical interactions between Cu and thiol (—SH) termini in MPTMS SAMs at Cu/$SiO_2$ interfaces enhance interfacial adhesion by a factor of 3 and increase failure times for Cu-transport-induced $SiO_2$ breakdown by a factor of 4.

EXAMPLES

Cu/MPTMS/$SiO_2$ structures were fabricated on n-type, device-quality Si(001) wafers with a 100-nm-thick dry thermal $SiO_2$ layer grown at 1000° C. The wafers were cleaned successively in xylene, acetone, isopropanol and DI water, and dried in flowing $N_2$. The $SiO_2$ surfaces were either treated in a 30% $H_2O_2$–70% $H_2SO_4$ solution at 60° C. for 30 minutes (or an ozone plasma for 15 minutes), to facilitate SAM formation through surface hydroxylation. MPTMS SAMs were formed on $SiO_2$ by dipping the wafers in a 5 mM MPTMS solution in toluene for 30 min., and dried, in a $N_2$ glove box. The samples were rinsed with toluene and methanol, and dried with a $N_2$ jet to remove excess MPTMS molecules unattached to $SiO_2$.

Variable angle spectroscopic ellipsometry (VASE) carried out in a VASE M-44 instrument at 60–70° incident angles show that the formed MPTMS SAMs have a thickness of 0.67±0.1 nm, in good agreement with the theoretical molecular length (~0.7 nm) of MPTMS. Sessile 50 μL DI water drops on MPTMS exhibit a contact angle of 46.6±1.6°, characteristic of thiol-terminated hydrophilic SAM surfaces. These results indicate that MPTMS molecules organize themselves at a canted angle forming an ordered monolayer.

A 65-nm thick Cu layer was deposited on the SAM/$SiO_2$/Si(001) and reference $SiO_2$/Si(001) structures in a CVC DC sputter tool (base pressure 9×$10^{-7}$ Torr). The Cu/SAM/$SiO_2$/Si(001), and Cu/$SiO_2$/Si(001), stacks were bonded onto a Si(001) support wafer with an epoxy for interfacial adhesion tests. Interfacial debond energies were measured from the load-displacement curves obtained at a strain rate of 300 nm/s using a high-stiffness 4-point-bend micromechanical test system, as described previously. R. H. Dauskardt, M. Lane, Q. Ma, and N. Krishna, Eng. Fract. Mech. 61, 141 (1998). At least six tests were conducted on each sample-type to verify reproducibility. X-ray photoelectron spectroscopy (XPS) measurements were carried out to investigate interface chemistry on as-prepared and fracture surfaces in a PHI 5400 instrument with a Mg $K_\alpha$ probe beam.

Figure 6:
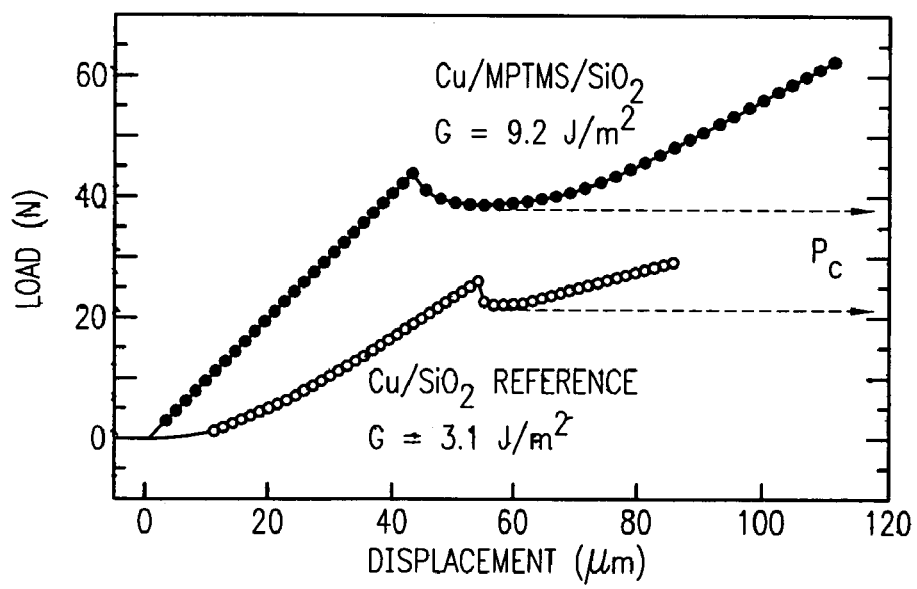
FIG. 6 shows representative load vs. displacement plots obtained from adhesion test samples of Cu/SAM/SiO$_2$ and Cu/SiO$_2$ composite structures.

FIG. 6 shows representative load vs. displacement plots obtained from adhesion test samples of Cu/SAM/$SiO_2$ and Cu/$SiO_2$ structures. The plateaus observed in the two curves correspond to the respective critical loads $P_c$ at which debonding occurs at the weakest interface. Cu/MPTMS/$SiO_2$ structures show a $P_c$ of ~38 N, which is a factor of 1.7 higher than the critical load of ~22 N needed to debond the Cu/$SiO_2$ interface. Since plastic flow in $SiO_2$ and Cu is constrained under our loading conditions, the interfacial debond energy (G) was determined from the equation G=K $(1-v^2)P_c^2$/E. R. H. Dauskardt, M. Lane, Q. Ma, and N. Krishna, Eng. Fract. Mech. 61, 141 (1998). E and v are the elastic modulus and poisson's ratio of the substrate, respectively, and K is a constant that is dependent on the loading geometry and the substrate thickness. The results show that Cu/MPTMS/$SiO_2$ structure has a debond energy of 9.2 J/m², which is ~3 times higher than that of pristine Cu/$SiO_2$ interfaces (3.1 J/m²).

Figure 7:
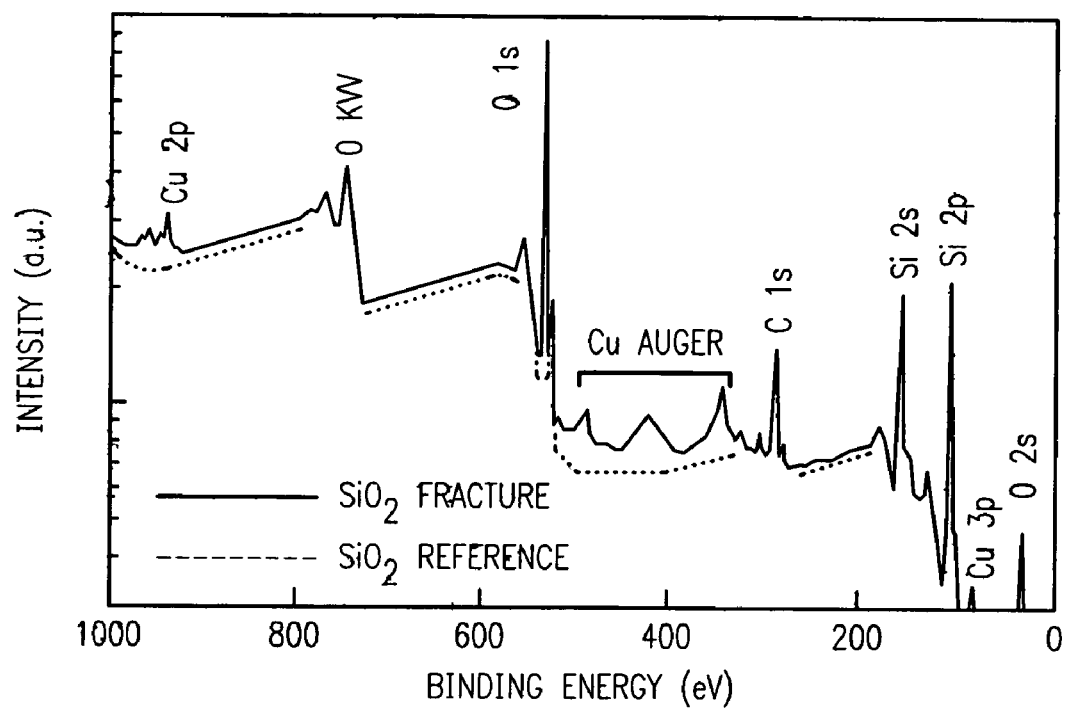
FIG. 7 shows and compares representative spectra (plotted on a log scale to reveal weak peaks) obtained from a SiO$_2$ fracture surface, and a SiO$_2$ reference sample.

In order to understand the delamination mechanism, fracture surfaces were probed using XPS. FIG. 7 compares representative spectra (plotted on a log scale to reveal weak peaks) obtained from a $SiO_2$ fracture surface, and a $SiO_2$ reference sample. The low intensity Cu 2p, and 3p bands, and Auger peaks arising from trace amounts of Cu on $SiO_2$ fracture surfaces indicate that the measured debond energies provide a lower bound estimate for MPTMS-treated Cu/$SiO_2$ interfaces.

Figure 8A:
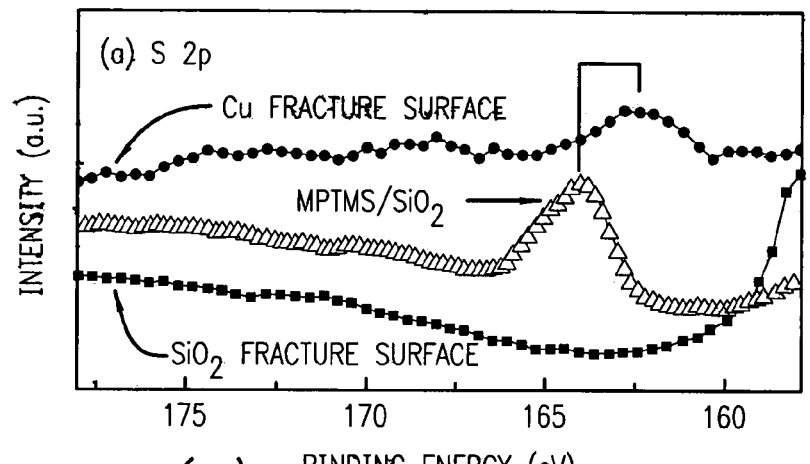
FIGS. 8(a)–8(c) show graphs of the results of XPS measurements.
Figure 8B:
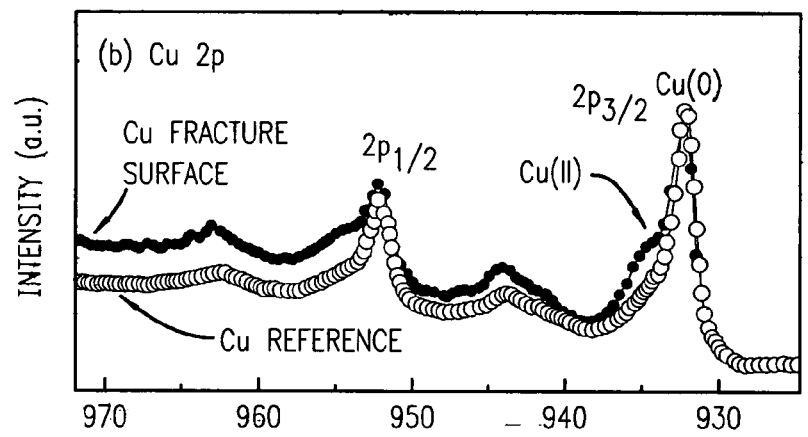

High-resolution XPS measurements, described below, show that S is bound to the Cu fracture surface and is covered by silyl-propyl [—$(CH_2)_3$—Si<—] moieties which detach from the $SiO_2$ surface. $SiO_2$ fracture surfaces did not show any detectable S 2p bands (see FIG. 8(a)), while Cu fracture surfaces exhibit a weak S 2p peak at ~162.5 eV. This band is ~1.5 eV lower than that obtained from reference MPTMS SAMs on $SiO_2$, suggesting a chemical interaction between S and Cu. This inference is corroborated by Cu fracture surfaces (see FIG. 8(b)) showing a Cu(II) sub-band at ~934.5 eV in addition to the elemental Cu(0) band at ~932 eV. At least a part of this Cu(II) sub-band intensity is due to Cu—S interactions, confirmed by a much weaker Cu(II)/Cu (0) intensity ratio observed in reference Cu samples with a surface oxide.

Figure 8C:
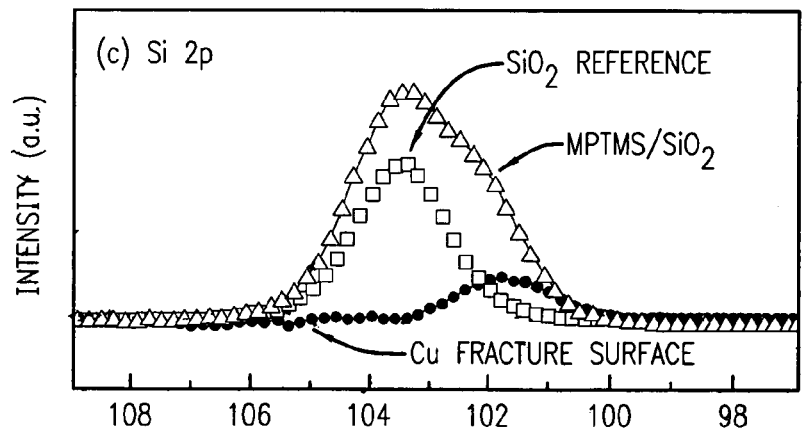

Cu fracture surfaces also exhibit a Si 2p band (FIG. 8(c)) at ~101.7 eV, which is a signature of silyl-alkyl moieties. D. R. Lide (editor), CRC Handbook of Chemistry and Physics, CRC press, Cleveland, Ohio (1999). This band is seen in reference samples of MPTMS on $SiO_2$ as a low-energy shoulder to the Si 2p peak at ~103.5 eV from $SiO_2$, but is absent in spectra from pristine as well as fracture surfaces of $SiO_2$. The presence of silyl-alkyl groups is consistent with Cu fracture surfaces showing a strong C 1s band (FIG. 7) and a weak S 2p band intensity, the latter due to signal attenuation.

The above results demonstrate that Cu/MPTMS/$SiO_2$ structures delaminate at the SAM/$SiO_2$ interface, and not the Cu/SAM interface (showing that Cu is strongly bound to the SAM layer). The terminal S atoms of the SAM are strongly bound to the Cu surface, and the propyl-silane moieties end up on the Cu fracture surface by detaching from the SiO$_2$ surface. Since Si—O—Si bonds are strong compared to Cu—S interactions, the results at the MPTMS/SiO$_2$ interface may be attributed to the inadequate number of Si—O—Si bonds between MPTMS and SiO$_2$ during self-assembly. Formation of lateral siloxane linkages between adjacent organosilane molecules is the likely reason for insufficient Si—O—Si bonds with the substrate. Devising processes to form SAMs with increased siloxane linkages with the substrate can lead to further enhancements in adhesion.

In order to investigate if the strong chemical interactions between Cu and S in MPTMS SAM layers and the inhibition of Cu diffusion into SiO$_2$, bias thermal annealing (BTA) tests were conducted on Cu/SAM/SiO$_2$/Si(001)/Al metal-oxide semiconductor (MOS) capacitors in flowing N$_2$ at 200° C. in a 2 MV/cm electric field. The MOS structures were fabricated by standard procedures described previously (A. Krishnamoorthy, K. Chanda, S. P. Murarka, J. G. Ryan, and G. Ramanath, Appl. Phys. Lett. 78, 2467 (2001)). The leakage current $j_{leakage}$, due to Cu diffusion (A. Krishnamoorthy, K. Chanda, S. P. Murarka, J. G. Ryan, and G. Ramanath, Appl. Phys. Lett. 78, 2467 (2001); J. D. McBrayer, R. M. Swanson, and T. W. Signrmon, J. Electrochem. Soc. 133, 1243 (1986)) was recorded at 30 min intervals using a HP4140 picoammeter, after cooling the sample to room temperature for each measurement until electrical breakdown of SiO$_2$ characterized by $j_{leakage}$>1000 nA cm$^2$.

Figure 9:
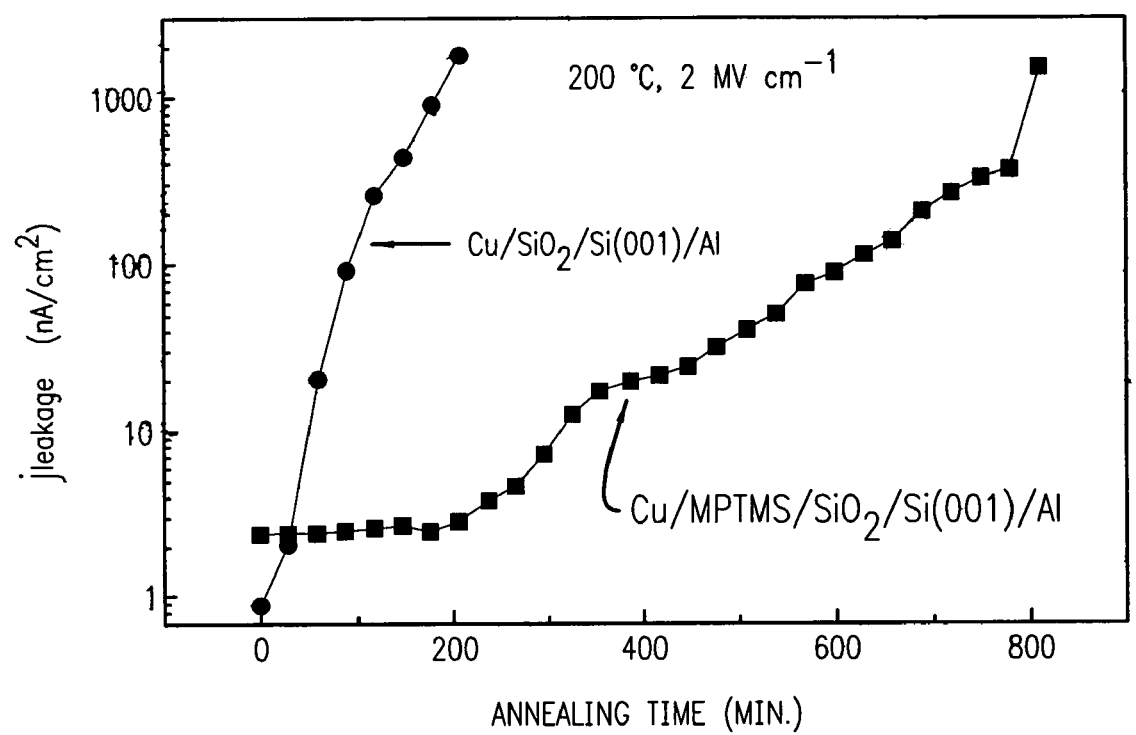
FIG. 9 shows a graph of $j_{leakage}$ vs. annealing time.

The results (see FIG. 9) obtained demonstrate that SAM layers derived from MPTMS molecules indeed hinder Cu diffusion into SiO$_2$. Capacitors with MPTMS at the interface show lower leakage currents and a factor of 4 increase in time for Cu-transport-induced SiO$_2$ breakdown, compared with those measured from capacitors without a SAM layer.

In summary, sub-nanometer layers including molecules such as MPTMS offer an attractive mechanism for enhancing interfacial adhesion and inhibiting Cu transport across Cu/SiO$_2$ interfaces through local chemical immobilization of Cu. Similar strategies with SAMs of difunctional molecules open up possibilities for preserving the structural and functional integrity of interfaces between nanoscale units of newly evolving device structures.

All of the above patents, patent applications, and publications are herein incorporated by reference in their entirety for all purposes. None of the cited patents, patent applications, and publications is admitted to be prior art.

Those skilled in the art will appreciate that various adaptations and modifications of the above-described embodiments can be configured without departing from the scope and spirit of the inventions. Therefore, it is to be understood that, within the scope of the appended claims, the invention may be practiced other than as specifically described herein. Moreover, one or more features of an embodiment of the invention may be combined with any other feature of any other embodiment of the invention without departing from the spirit and scope of the invention.

What is claimed is:

1. An electrical device comprising:
   (a) a substrate;
   (b) a self-assembled molecular layer on the substrate, wherein the self-assembled molecular layer comprises a plurality of molecules, each molecule comprising a first end proximate to the substrate and a second end comprising sulfur distal to the substrate; and
   (c) a copper layer on the self-assembled molecular layer, wherein the copper layer comprises copper atoms bound to said sulfur.

2. The electrical device of claim 1 wherein the electrical device is a microelectronics device.

3. The electrical device of claim 1 wherein the substrate comprises silicon and silicon oxide.

4. The electrical device of claim 1 wherein the electrical device is a circuit board.

5. The electrical device of claim 1 wherein each molecule is or is derived from a mercaptoalkyltrialkoxysilane.

6. The electrical device of claim 1 wherein the self-assembled molecular layer has a thickness of about 0.7 nanometers or less.

7. The electrical device of claim 1 wherein the electrical device does not exhibit an electrical breakdown after being subjected to bias thermal annealing in flowing nitrogen at 200° C. in a 2 MV/cm electric field for at least about 600 minutes, wherein the electrical breakdown is characterized by $j_{leakage}$>1000 nA/cm$^2$.

8. The electrical device of claim 7 wherein the self-assembled molecular layer has a thickness of about 1.0 nanometers or less.

9. The electrical device of claim 7 wherein each molecule has a carbon chain, and wherein the carbon chain has 5 carbon atoms or less.

10. The electrical device of claim 1 wherein an interface debond energy between the self-assembled molecular layer and the copper layer is greater than about 6 J/m$^2$.

11. The electrical device of claim 1 wherein an interface debond energy between the self-assembled molecular layer and the copper layer is greater than about 8 J/m$^2$.

12. The electrical device of claim 7 wherein an interface debond energy between the self-assembled molecular layer and the copper layer is greater than about 6 J/m$^2$.

13. The electrical device of claim 7 wherein an interface debond energy between the self-assembled molecular layer and the copper layer is greater than about 8 J/m$^2$.

14. The electrical device of claim 1 wherein the substrate comprises a via having a via wall, and wherein the self-assembled molecular layer coats the via wall and copper is on the self-assembled molecular layer in the via.

15. The electrical device of claim 1 wherein the substrate is in the form of a dielectric layer.

16. A method for forming an electrical device, the method comprising:
   (a) providing a substrate;
   (b) forming a self-assembled molecular layer on the substrate, wherein the self assembled molecular layer comprises a plurality of molecules, each molecule comprising a first end proximate to the substrate and a second end comprising sulfur distal to the substrate; and
   (c) forming a copper layer on the self-assembled molecular layer, wherein the copper layer comprises copper atoms bound to said sulfur.

17. The method of claim 16 wherein the electrical device is a microelectronics device.

18. The method of claim 16 wherein the substrate comprises silicon and silicon oxide.

19. The method of claim 16 wherein the electrical device is a circuit board.

20. The method of claim 16 wherein each molecule is or is derived from a mercapto-alkyl-trialkoxy-silane.

21. The method of claim 16 wherein the self-assembled molecular layer has a thickness of about 0.7 nanometers or less.

22. The method of claim 16 further comprising after (a) and before (b): pretreating the substrate.

23. The method of claim 22 wherein pretreating comprises hydroxylating a surface of the substrate.

24. The method of claim 16 wherein forming the self-assembled molecular layer comprises depositing a solution comprising precursors of the plurality of molecules on the substrate.

25. The method of claim 16 wherein forming the copper layer comprises vapor depositing.

26. The method of claim 16 wherein forming the copper layer comprises sputtering.

27. An electrical device comprising:
  (a) a semiconductor substrate;
  (b) a self-assembled molecular layer on the substrate, wherein the self-assembled molecular layer comprises a plurality of molecules, each molecule comprising a first end proximate to the substrate and a second end comprising sulfur distal to the substrate, and each molecule being less than about 1 nanometer in length; and
  (c) a copper layer on the self-assembled molecular layer, wherein the copper layer comprises copper atoms bound to said sulfur, wherein the electrical device does not exhibit an electrical breakdown after being subjected to bias thermal annealing in flowing nitrogen at 200° C. in a 2 MV/cm electric field for at least about 600 minutes, wherein the electrical breakdown is characterized by $j_{leakage} > 1000$ nA/cm$^2$, and wherein an interface debond energy between the self-assembled molecular layer and the copper layer is greater than about 8 J/m$^2$.

28. The electrical device of claim 1 wherein said molecule comprising a first end proximate to the substrate and a second end comprising sulfur distal to the substrate further comprises an intermediate portion comprising a carbon chain of the formula —$(CH_2)_n$— wherein n is an integer that is less than 20.

29. The electrical device of claim 1 wherein said molecule comprising a first end proximate to the substrate and a second end comprising sulfur distal to the substrate is or is derived from a alkyltrioxysilane with a terminal sulfur containing functional group.

* * * * *